United States Patent
Boduch et al.

(10) Patent No.: US 8,328,026 B2
(45) Date of Patent: Dec. 11, 2012

(54) APPARATUS AND METHOD FOR CONFIGURING A DUAL RACK-MOUNTABLE CHASSIS

(75) Inventors: Mark E. Boduch, Geneva, IL (US); Kimon Papakos, Chicago, IL (US); Scott A. Blakemore, Warrenville, IL (US); David J. Womac, St. Charles, IL (US)

(73) Assignee: Tellabs Operations, Inc., Naperville, IL (US)

( * ) Notice: Subject to any disclaimer, the term of this patent is extended or adjusted under 35 U.S.C. 154(b) by 408 days.

(21) Appl. No.: 12/036,041

(22) Filed: Feb. 22, 2008

(65) Prior Publication Data

US 2008/0217962 A1 Sep. 11, 2008

Related U.S. Application Data

(60) Provisional application No. 60/902,985, filed on Feb. 22, 2007.

(51) Int. Cl.
*A47F 7/00* (2006.01)
(52) U.S. Cl. .................................................. 211/26
(58) Field of Classification Search .............. 211/26, 211/40, 41.12, 41.17, 49.1; 361/694, 695, 361/716, 721; 174/16.1; 165/104.34, 122; 454/184
See application file for complete search history.

(56) References Cited

U.S. PATENT DOCUMENTS

| | | | | |
|---|---|---|---|---|
| 2,917,676 A | | 12/1959 | Daniels | 317/99 |
| 2,987,364 A | * | 6/1961 | Fall | 312/334.8 |
| 3,081,139 A | | 3/1963 | Hines et al. | 312/351 |
| 4,553,674 A | * | 11/1985 | Yoshikawa et al. | 211/26 |
| 5,398,822 A | * | 3/1995 | McCarthy et al. | 211/41.17 |
| 5,896,273 A | | 4/1999 | Varghese et al. | 361/724 |
| 5,991,163 A | | 11/1999 | Marconi et al. | 361/788 |
| 6,025,989 A | | 2/2000 | Ayd et al. | 361/695 |
| 6,181,549 B1 | | 1/2001 | Mills et al. | 361/683 |
| 6,195,493 B1 | | 2/2001 | Bridges | 385/134 |
| 6,388,891 B1 | | 5/2002 | Falkenberg et al. | 361/796 |
| 6,554,142 B2 | | 4/2003 | Gray | 211/26 |
| 6,594,148 B1 | * | 7/2003 | Nguyen et al. | 361/695 |

(Continued)

FOREIGN PATENT DOCUMENTS

JP 2001-345578 12/2001

OTHER PUBLICATIONS

Converting Multi-Degree SBOADM Configurations, 76.7144FP41/25, Tellabs 7100 Optical Transport System. Tellabs, Inc., Revision A, Jun. 2007. 220 sheets.
Converting Multi-Degree SBOADM Configurations, 76.7144FP42/25, Tellabs 7100 Optical Transport System. Tellabs, Inc., Revision B, Jan. 2008. 154 sheets.
Converting Multi-Degree SBOADM Configurations, 76.7144FP43/25, Tellabs 7100 Optical Transport System. Tellabs, Inc., Revision A, Apr. 2008. 158 sheets.

(Continued)

*Primary Examiner* — Darnell Jayne
*Assistant Examiner* — Patrick Hawn
(74) *Attorney, Agent, or Firm* — Fitzpatrick, Cella, Harper & Scinto

(57) ABSTRACT

A chassis having a housing in which at least one card module can be arrange is provided. The chassis is arranged in a first rack horizontally or a second rack vertically wherein the second rack opening width is an integer multiple of the predetermined chassis width. A fan slot and ventilation openings are provided in the chassis to allow for airflow across the card modules. Mounting mechanisms facilitate coupling of the chassis to the first and second rack and include ventilation openings through which air passes.

21 Claims, 12 Drawing Sheets

U.S. PATENT DOCUMENTS

| | | | |
|---|---|---|---|
| 6,597,576 B1 | 7/2003 | Smith et al. | 361/724 |
| 6,824,312 B2 | 11/2004 | McClellan et al. | 385/88 |
| 6,927,983 B1 | 8/2005 | Beseth et al. | 361/796 |
| 2003/0223196 A1* | 12/2003 | Smith et al. | 361/687 |
| 2004/0145869 A1* | 7/2004 | Tanaka et al. | 361/695 |
| 2004/0196631 A1* | 10/2004 | Ueda et al. | 361/695 |
| 2005/0052843 A1* | 3/2005 | Baker et al. | 361/687 |
| 2005/0068722 A1* | 3/2005 | Wei | 361/686 |
| 2005/0162831 A1* | 7/2005 | Shum et al. | 361/695 |
| 2005/0254210 A1* | 11/2005 | Grady et al. | 361/695 |
| 2006/0126292 A1* | 6/2006 | Pfahnl et al. | 361/695 |
| 2006/0180556 A1 | 8/2006 | Shih et al. | 211/26 |
| 2006/0225481 A1 | 10/2006 | Kato et al. | 73/1.01 |
| 2006/0274515 A1 | 12/2006 | Arthur et al. | 361/796 |
| 2008/0205028 A1 | 8/2008 | Papakos et al. | 361/826 |
| 2008/0233858 A1 | 9/2008 | Womac et al. | 454/184 |

OTHER PUBLICATIONS

System Engineering, 76.7144FP43/6, Tellabs 7100 Optical Transport System. Tellabs, Inc., Revision A, Apr. 2008. 332 sheets.

Expansion Procedure, 76.7144FP43/13, Tellabs 7100 Optical Transport System. Tellabs, Inc., Revision A, Apr. 2008. 562 sheets.

*Thermal Computations for Electronic Equipment.* Gordon N. Ellison. Van Nostrand Reinhold Company Inc. 1984. pp. 141-160.

*2000-2001 Oriental Motor General Catalogue, Section C, Cooling Fans,* http://www.orientalmotor.com/products/pdfs/CoolingFans/SectionCIntro__C2-C27.pdf, Oriental Motor U.S.A. Corp. 2000. pp. C-12, C-13, C-16, and C-22 to C-27.

*2005-2006 Oriental Motor General Catalogue, Section F, Technical Reference, Motor and Fan Sizing, Fan Sizing Calculations,* http://www.orientalmotor.com/products/pdfs/F_TecRef/TecFanSiz.pdf Oriental Motor U.S.A. Corp. 2005. p. F-11.

* cited by examiner

1st Chassis (2nd half empty)

APPARATUS AND METHOD FOR CONFIGURING A DUAL RACK-MOUNTABLE CHASSIS

CROSS REFERENCE TO RELATED APPLICATIONS

This application claims the benefit of priority under 35 U.S.C. §119(e) to U.S. provisional patent application No. 60/902,985, filed Feb. 22, 2007, the entire contents of which are incorporated by reference as if fully set forth herein, including Appendices 1-11.

FIELD

Example embodiments of the invention described herein relate generally to mounting arrangements for rack-mountable electronic equipment, and more particularly, to methods of configuring a dual (or plural) rack-mountable chassis.

BACKGROUND

Modular electronic equipment typically is designed to be arranged within standard sized racks. Each rack typically includes first and second vertical supports that are separated by an opening. The opening widths of racks tend to be standard sized, as adopted by industry, manufacturers, and/or governments. In the United States, for example, telecommunication service providers often use racks having opening widths of twenty-three (23) inches, whereas telephone companies in European countries often use racks having opening widths of nineteen (19) inches.

Rack mountable electronic equipment often is modular. Often, modular electronic equipment is installed into a chassis and the chassis is then mounted within the opening of a rack. In the case of modular communication equipment, a chassis may house optical electronic equipment such as transmitters, receivers, intelligent control interface modules, power supplies, and the like. A chassis may also house cooling fans or other cooling mechanisms to aid in controlling the operating temperature of the equipment modules.

In a typical scenario, an electronic equipment module (hereinafter referred to as "a module") slides into a slot (or slots) in the chassis and connects at one end to a chassis backplane that has mating communication connectors to receive the module.

As a result of the differences in sizing of rack opening widths, rack mountable electronic equipment designers must design equipment to fit within the various rack geometries. This increases the costs of design, manufacturing, installation, maintenance, and distribution, for example. Various attempts have been made to address these limitations.

Existing chassis often are constructed to fit within a standard rack, wherein the chassis has various slots defined therein for receiving equipment.

As demands for functionality of electronic equipment increase, designers are confronted by space limitations in placing electronic components in equipment. Constraints on design can include component placement, manufacturing limitations, thermal limitations and cooling requirements, and structural constraints to deal with handling, shock, and vibration. Thus, as the demands for functionality increase, so does the desire to utilize a circuit board form factor as large as possible. In addition, electrical equipment products are often designed to optimally fit in one primary rack opening width. However, optimizing the configuration of the equipment for only a single rack can result in a suboptimal configuration if the same equipment is used in a different rack, such as when space in the other rack remains unoccupied as a result of installing equipment specifically designed for the single rack. When attempting to mount the same equipment into different racks, equipment designers are often limited by the size and layout of components and the configuration of the rack, which can result in valuable space within the rack remaining unused. The results often include higher component density circuit boards, greater need for forced cooling of mounted components due to reduced surface area on the circuit board, and the need to use additional racks and floor space to house additional equipment.

Moreover, this equipment specialization can increase design, manufacturing, and distribution costs for such equipment.

SUMMARY

According to one example embodiment of the invention, a method of configuring a rack-mountable chassis is provided. The method includes measuring a length and width of a card module slot of the chassis, a first opening width of a first rack for housing the chassis, and a second opening width of a second rack for housing the chassis, where the first opening width is greater than the second opening width. The method may also include verifying whether the first opening width is sufficiently wide to allow enough clearance between at least one side of the chassis and the first rack when the chassis is disposed in the first rack, to allow for the adequate cooling of housed components. If the first opening width is sufficiently wide, a dimension of at least one parameter related to the configuration of the chassis is determined so that the second opening width is a multiple of a total chassis width of the chassis. According to another example embodiment of the invention, a chassis is provided configured according to the method.

BRIEF DESCRIPTION OF THE DRAWINGS

Other features of example embodiments of the invention will be more readily understood from the following detailed description of specific embodiments thereof when read in conjunction with the accompanying drawings, in which.

Identically labeled elements appearing in different ones of the figures represent the same components and may not be described separately in detail in the description of each figure. However, it is noted that chassis 300 of FIG. 3 is shown with card modules installed therein, whereas in at least some other figures, the chassis 300 is shown with those modules removed.

DETAILED DESCRIPTION

The terms "vertical" and "vertically," as used herein, mean extending in a plane substantially perpendicular to a reference surface, such as a horizontal surface or other reference surface. The term "horizontal" and "horizontally," as used herein, mean extending in a plane substantially parallel to the reference surface.

Figure 3:
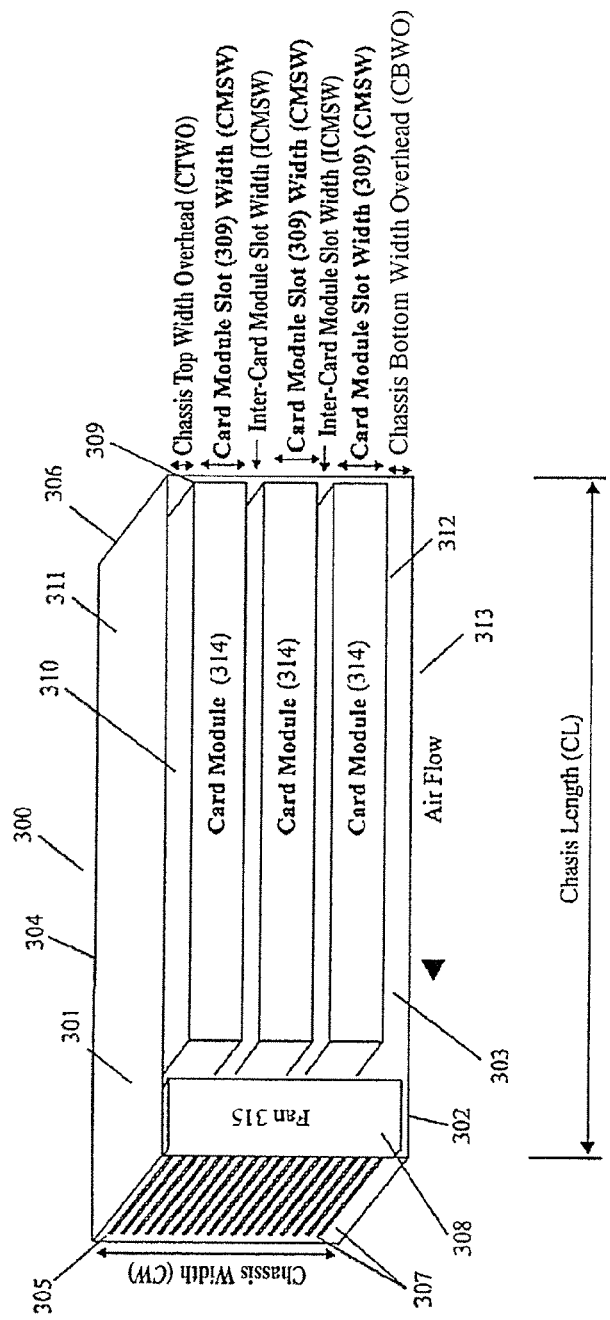
FIG. 3 is a perspective view of a dual rack mountable chassis that is constructed according to an example embodiment of the invention.

FIG. 3 illustrates a rack-mountable chassis 300 constructed in accordance with an example embodiment. The chassis 300 comprises a first lateral side 305 and second lateral side 306, and a top 301, bottom 302, front 303, and rear side 304, which together form a housing that has a square or rectangular shape, although in other embodiments the housing may have another desired shape. The first lateral side 305 and the second lateral side 306 have at least one ventilation hole or slot 307 formed therein. The chassis 300 can be constructed of a metal structure having welded seams, although in other embodiments it may be formed with other materials and the components 301-306 may be formed integrally with each other or coupled together by other means.

The chassis 300 includes a plurality of slots 308, 309 formed therein, although the number of such slots (and their size and orientation) are not limited to the examples shown in FIG. 3. These slots 308, 309 are sized to receive and house serviceable components that can be accessed from a front side of the chassis 300. The components can include, for example, fan equipment such as at least one fan 315, and card modules 314, respectively. In the illustrated embodiment, slot 308 forms a fan compartment and slots 309 form card module slots for receiving at least one card module 314.

The fan slot 308, in one example embodiment, is positioned with respect to card module slots 309 to provide for forced air movement across at least one card module slot 309 from second lateral side 306 to first lateral side 305. In this embodiment the chassis 300 employs a "pull" type ventilation system, wherein a exhaust side of the fan faces the first lateral side 305 of the chassis 300. In this way air is pulled through the chassis 300 rather than being pushed into the chassis 300 from an external source. As described above, the first lateral side 305 and second lateral side 306 of the chassis 300 each contain at least one ventilation opening. This feature enables air to enter and be expelled from the chassis 300, and air can be directed horizontally from right to left in that Figure through the chassis.

In another example embodiment of the invention, the chassis 300 can include components such as an air filter and/or air plenum (not shown in FIG. 3). In this embodiment, the chassis has at least one slot to house the at least one air filter. When the chassis includes an air plenum, at least one opening is included in at least one of the surfaces of the chassis, located on the intake side of the fan, such as an opening in the front side 303. This feature provides at least one additional passage for air to enter the front of the chassis. The air entering from the plenum is mixed with air entering from a lateral side of the chassis located on the low-pressure side of the fan.

The chassis geometry is defined in part by the chassis width (CW) and chassis length (CL). The chassis width (CW) is the sum of a chassis top width overhead (CTWO), one or more card module slot width(s) (CMSW), one or more inter-card module slot width(s) (ICMSW), and a chassis bottom width overhead (CBWO). The CTWO represents the distance between an upper boundary of an upper-most card module slot 309 and an upper surface of top side 301 of the chassis 300. The CBWO represents the distance between a lower boundary of a lower-most card module slot 309 and lower surface of bottom side 302 of the chassis 300. Therefore, the CTWO and CBWO include the thicknesses of the top and bottom sides, respectively, of the chassis. In another example embodiment of the chassis (not shown), other components may be disposed between the top side 301 and/or bottom side 302 of the chassis 300 and the respective adjacent card module slots, in which case the CTWO and/or CBWO include the dimension(s) of the additional components. The ICMSW is a distance between the upper boundary of a card module slot 309 and the lower boundary of the card module slot 309 disposed immediately above that former slot 309. The CMSW is the vertical height or thickness of a card module slot 309 (i.e., the distance from a lower boundary of the slot to the upper boundary of the same slot).

Referring again to FIG. 3, the chassis 300 contains the plurality of slots 308, 309 for engagement with various components, including fan modules, card modules, air plenums, and air filters. Although in the illustrated embodiment each slot 309 is shown as having only a single card module inserted therein, in other embodiments more than one module may occupy a single slot, or a card module may occupy more than one slot, depending on applicable design criteria.

Figure 1:
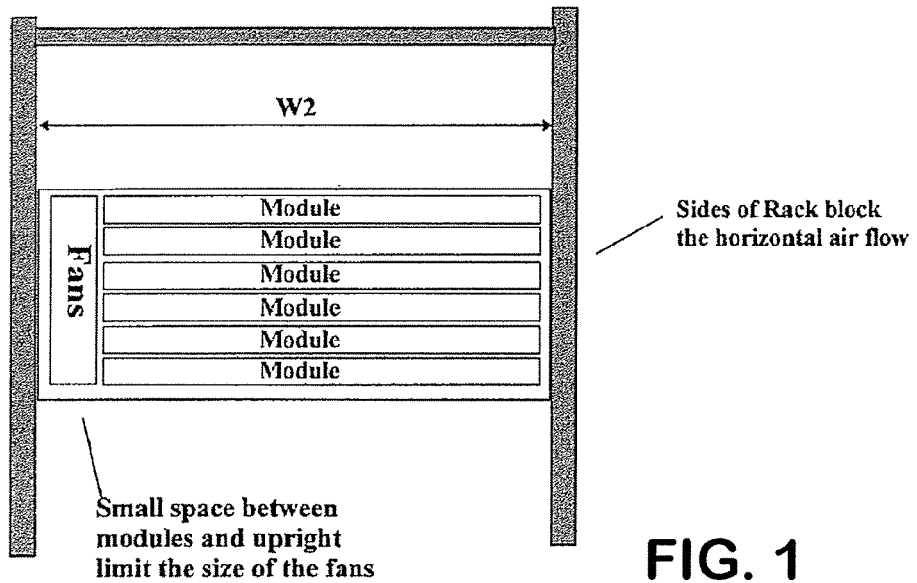
FIG. 1 is a schematic showing a front view of a example configuration of a chassis mounted horizontally in a rack.
Figure 2:
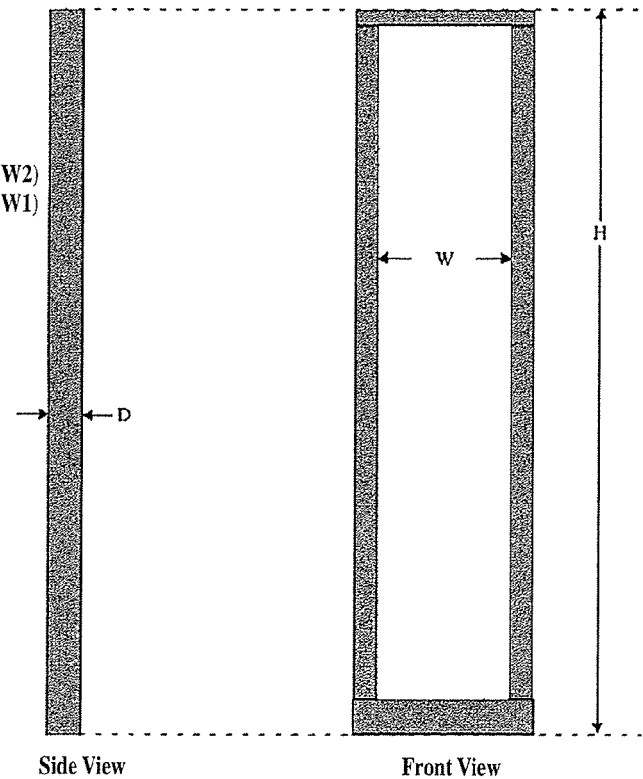
FIG. 2 is a schematic showing front and side views of a standard sized rack.

The chassis 300 can be sized to be rack-mountable within a specific pair (or other multiple) of racks. For example, the chassis 300 can be sized to be mounted in a first rack (rack 1) having an opening width of 21.5 inches (i.e., a standard 23 inch rack), and/or in a second rack (rack 2) having an opening width of 17.5 inches (i.e., a standard 19 inch rack), such as those of FIG. 2. However, one of ordinary skill in the art will appreciate in view of this description that the chassis 300 could also be mounted in racks having other dimensions instead.

Figure 4:
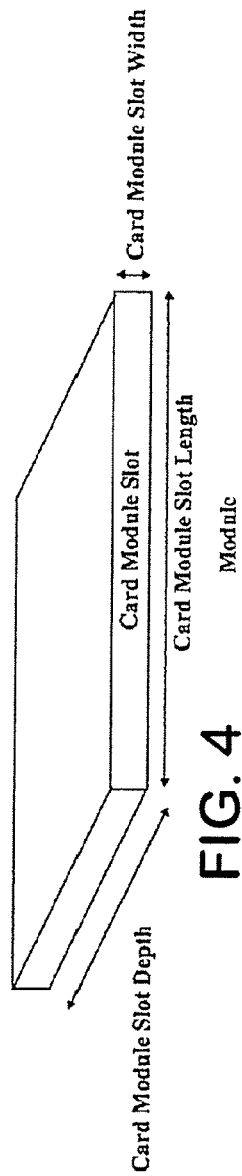
FIG. 4 is a perspective view of a volume of an example card module slot and some of its associated dimensions.

FIG. 4 represents the volume of a card module slot 309 into which one or more card modules can be inserted. In an example embodiment of the invention, the volume of card module slot 309 is defined by a card module slot length (CMSL), card module slot width (CMSW), and card module slot depth (CMSD). These measurements form a volume that can be at least partly occupied by at least one card module, or a portion of a card module (not shown in FIG. 4), when inserted into the slot 309.

Figure 5:
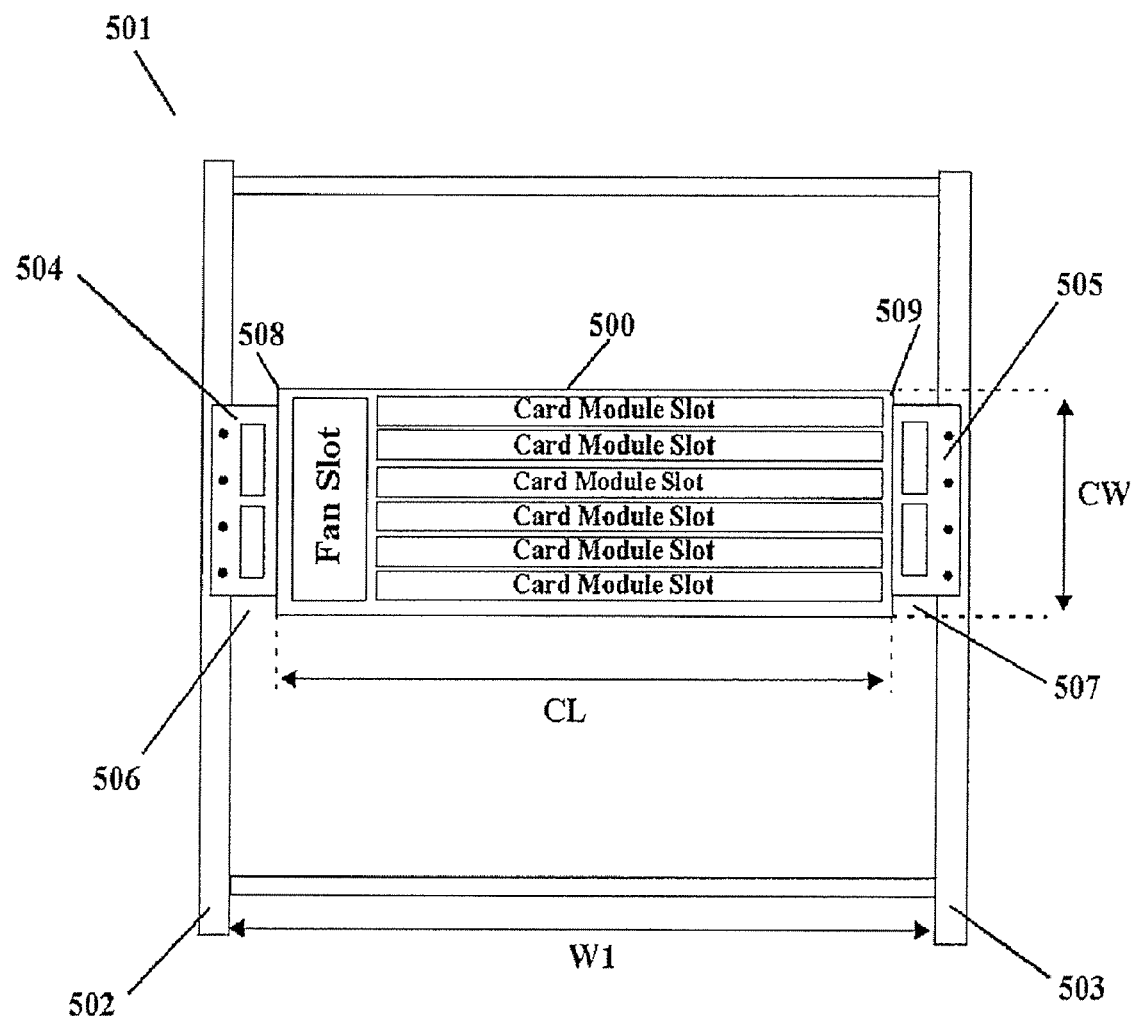
FIG. 5 shows a chassis, mounted horizontally in a first rack, configured with a fan compartment, and card module compartments constructed in accordance with an example embodiment of the invention, as viewed from a perspective looking towards a front side of the chassis.
Figure 7A:
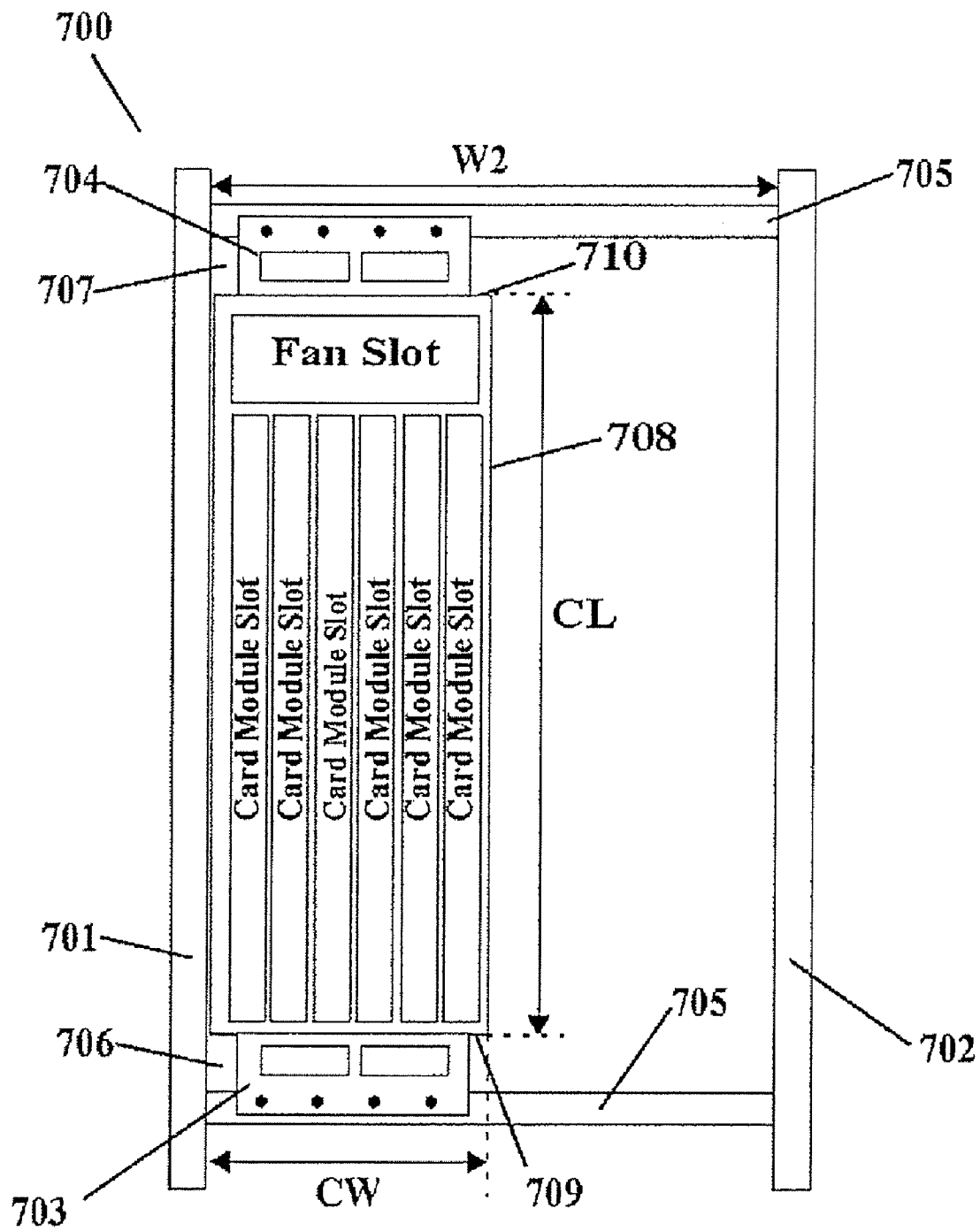
FIG. 7A shows an example of a chassis mounted vertically in a rack (rack 2), as viewed from a perspective looking towards a front side thereof.
Figure 7B:
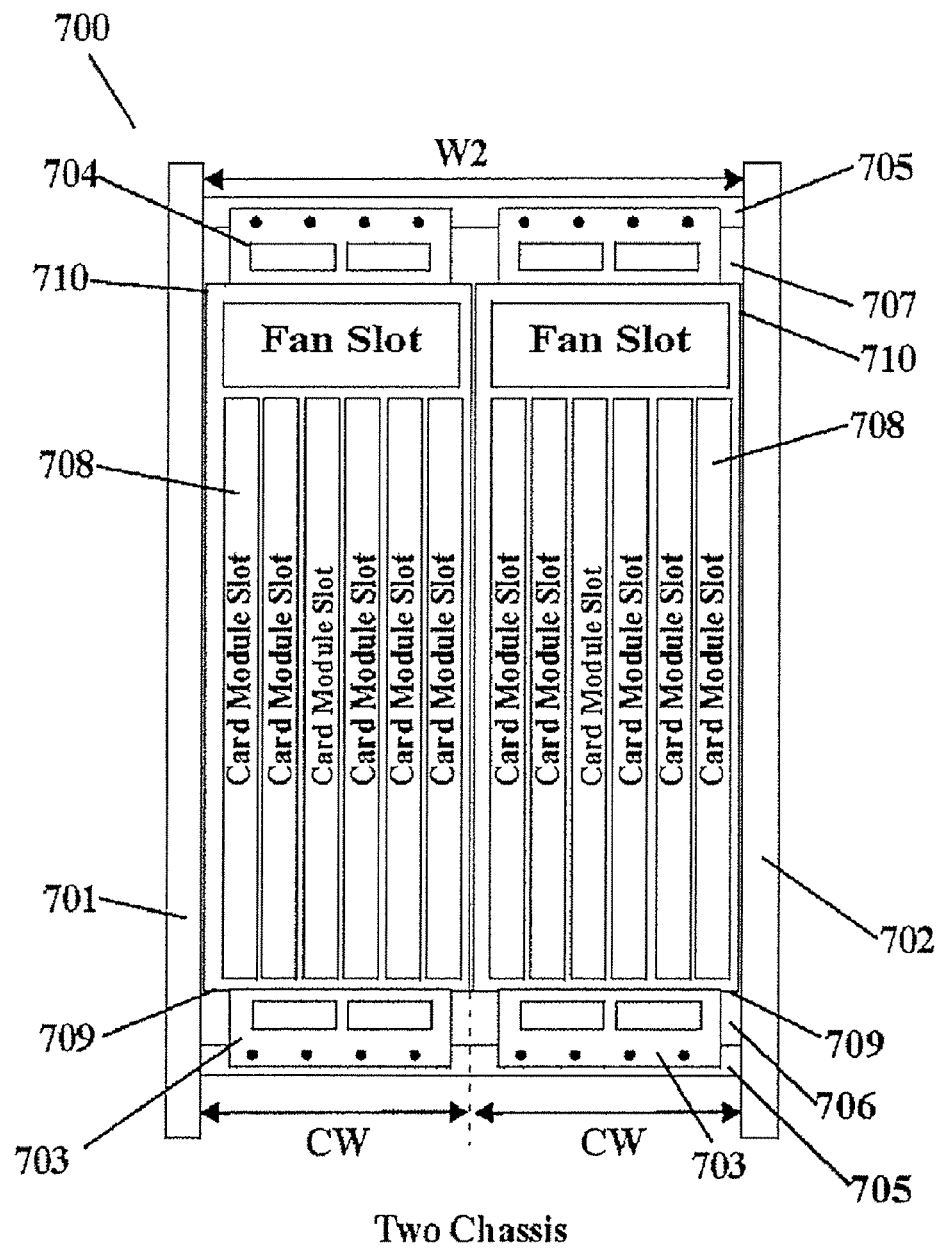
FIG. 7B shows an example of plural chassis mounted vertically in a rack, as viewed from a perspective looking towards a front side thereof.

FIG. 5 is a schematic diagram of a first rack (rack 1) 501 having an opening width W1 (e.g., 21.5 inches). FIGS. 7A and 7B show schematic diagrams of a second rack (rack 2) 700 having an opening width W2 (e.g., 17.5 inches), that is less than W1. A chassis, such as the chassis 300 of FIG. 3, mounted horizontally in the first rack 501 is designed so that it also can be mounted vertically in the second rack 700. This is done by sizing the chassis width (CW) in such a manner that W2 is an integer multiple of the chassis width (CW). Sizing the chassis in this way ensures that no appreciable space within the second rack is unused when chassis is fully populated with chassis. Design parameters that can affect the chassis width, and methods of configuring the chassis in the foregoing manner will be described below.

In the example embodiment of FIG. 5, the chassis 500 is mounted to rack 501 using front mounting brackets 504 and 505. A set of rear mounting brackets may also be used to mount the chassis 500, however, for convenience, these are not shown in FIG. 5. When the chassis 500 is mounted horizontally as shown, plenum gaps 506 and 507 are formed for providing horizontal airflow through the chassis. Front mounting bracket 504 (and also any corresponding rear mounting bracket) attaches first lateral side 508 of the chassis 500 to rack support 502. Mounting bracket 505 (and also any corresponding rear mounting bracket) attaches second lateral side 509 to rack support 503. The mounting brackets 504 and 505 (as well as any of their corresponding rear mounting brackets) couple chassis 500 to the rack 501 via screws, bolts, threaded fasteners, or the like.

Figure 6:
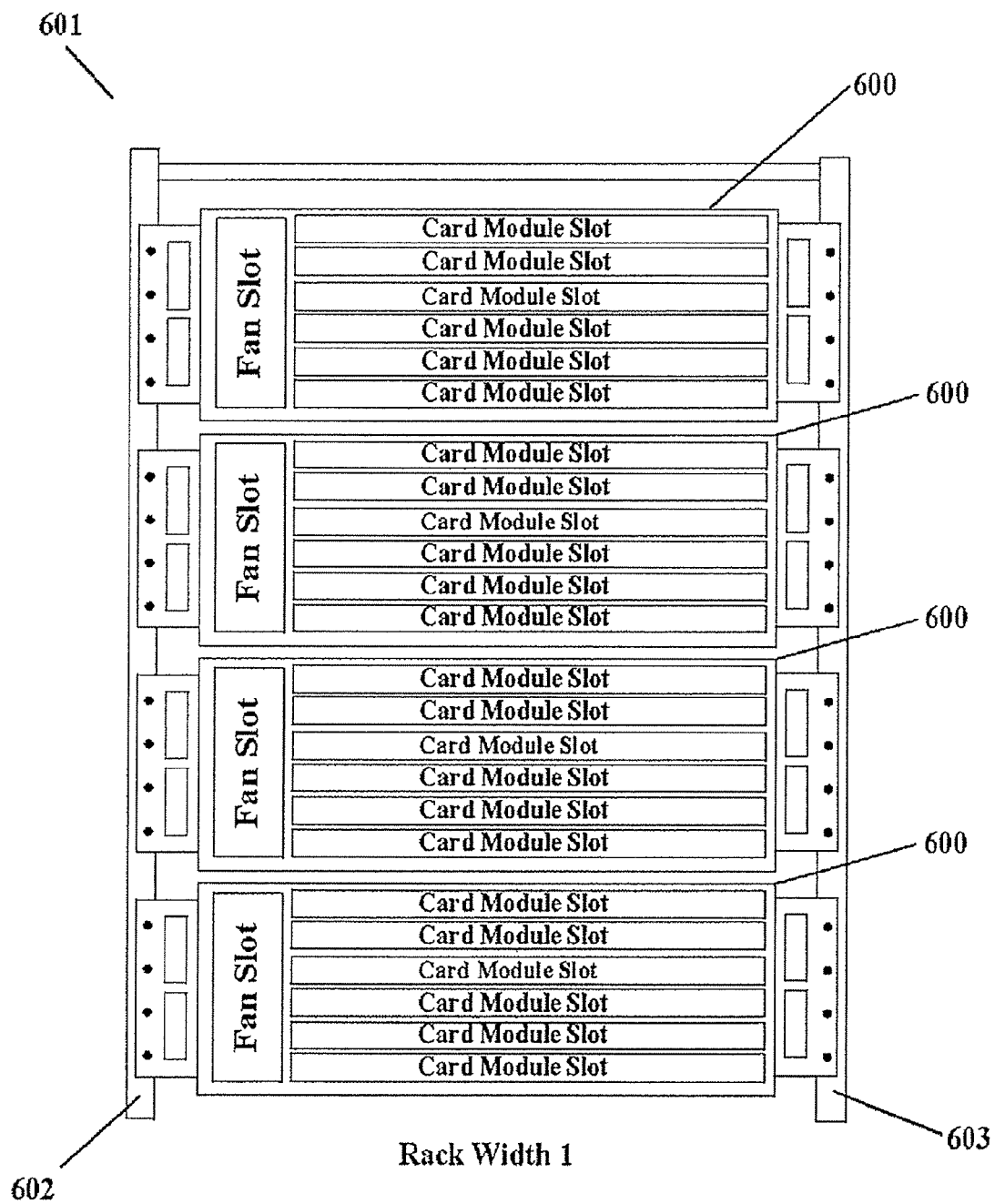
FIG. 6 shows an example of plural chassis mounted horizontally in a rack (rack 1), as viewed from a perspective looking towards a front side thereof.

In FIG. 6, four chassis 600 are mounted on top of each other in rack 601, which includes rack supports 602 and 603, although one of ordinary skill in the art will appreciate in view of this description that more or less than that number of chassis may be mounted in the rack 601, depending on applicable design criteria.

In FIG. 7A, a chassis 708 is mounted vertically in a rack (rack 2) 700, which has a second opening width W2 that is smaller than width W1 of FIG. 5. In FIG. 7B, two chassis 708 are mounted to horizontal supports 705, which in turn are connected to vertical supports 701 and 702 of the rack 700. Each chassis 708 is attached to the horizontal supports 705 by mounting brackets 703 and 704. A set of rear mounting brackets may also be used to mount the chassis 708, however, for convenience, these are not shown in FIG. 7A and FIG. 7B. The mounting bracket 703 (and also any corresponding rear mounting bracket) attaches the horizontal rack support 705 to the first lateral side 709 of the chassis 708. The mounting bracket 704 (and also any corresponding rear mounting bracket) connects the horizontal rack support 705 to the second lateral side 710 of the chassis 708. The mounting brackets 703 and 704 (and also any corresponding rear mounting brackets) attach the chassis 708 to the rack 700 with screws, bolts, threaded fasteners, or the like. In this manner, all of the horizontally-adjacent, vertically-mounted and aligned chassis 708 share one pair of horizontal supports 705. In the example embodiments shown in FIG. 7A and FIG. 7B, plenum air gap 707 is formed between the second lateral side 710 of the chassis and the adjacent rack support 705, and plenum air gap 706 is formed between the first lateral side 709 of the chassis and the adjacent rack support 705.

The mounting brackets 504, 505 (FIG. 5), 703 and 704 (FIGS. 7A and 7B) (and also any corresponding rear mounting brackets and other brackets described herein) can be metallic, although in other embodiments they may comprise any other suitable types of materials. The mounting brackets (and also any corresponding rear mounting brackets) may also be different from one another in size, material, type, and shape, and may be different from those depicted. Also, the mounting brackets (and also any corresponding rear mounting brackets) may be solid and attachable via any suitable attaching mechanism, or may include at least one hole or slot used for receiving one or more mounting screws, bolts and the like. In the example embodiments shown in FIGS. 5-7B, the mounting brackets 504, 505, 703, and 704 include at least one aperture through which air may pass. Alternatively, other example embodiments at least one mounting brackets may have no apertures formed therein.

The mounting brackets (e.g., 504, 505, 703, 704) (and also any corresponding rear mounting brackets) are sized sufficiently so that the sizes of the respective plenum air gaps 506, 507, 706, 707 are large enough to accommodate at least a predetermined amount of airflow there through.

Figure 8A:
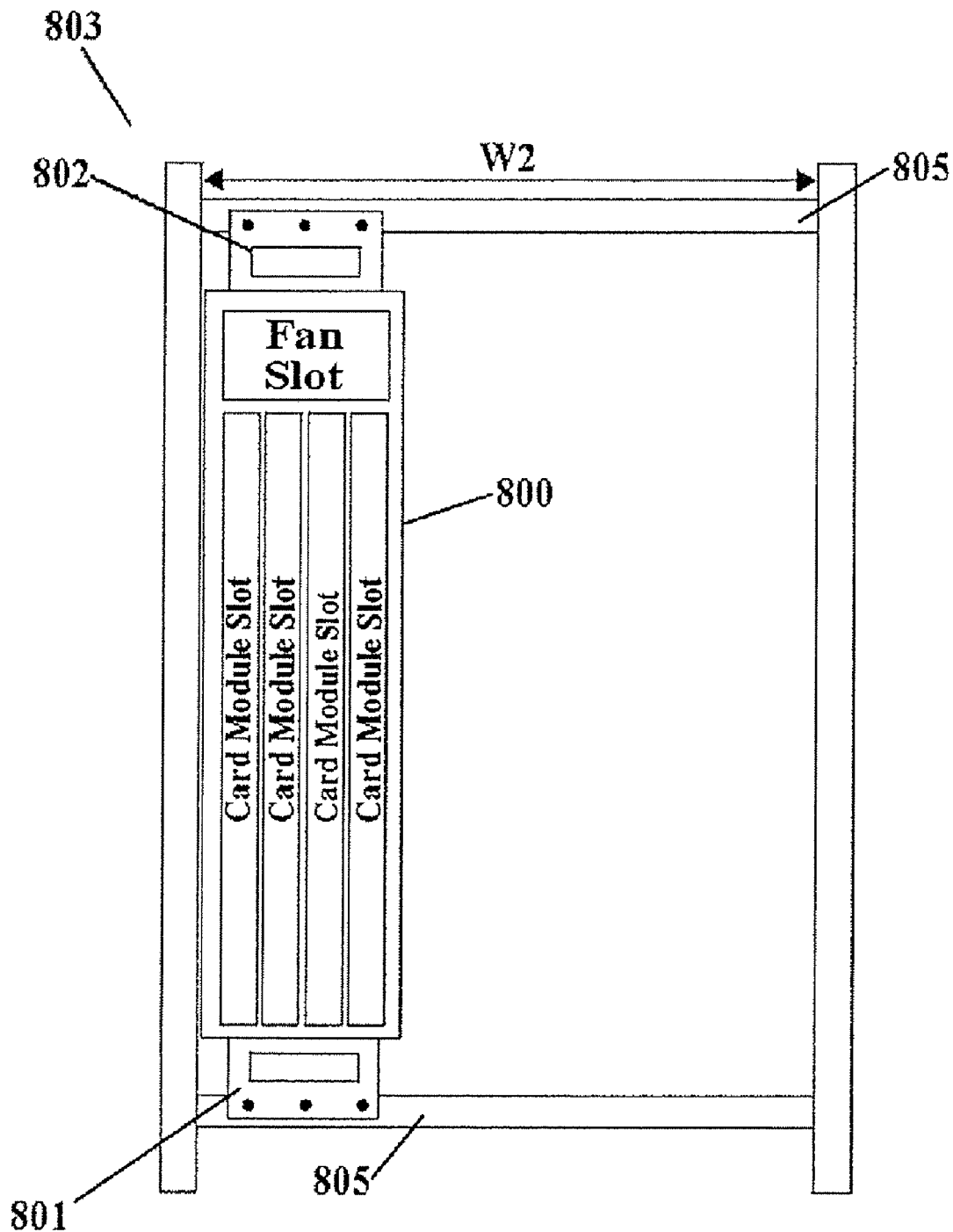
FIG. 8A shows an example of a chassis mounted vertically in a rack, as viewed from a perspective looking towards a front side thereof.
Figure 8B:
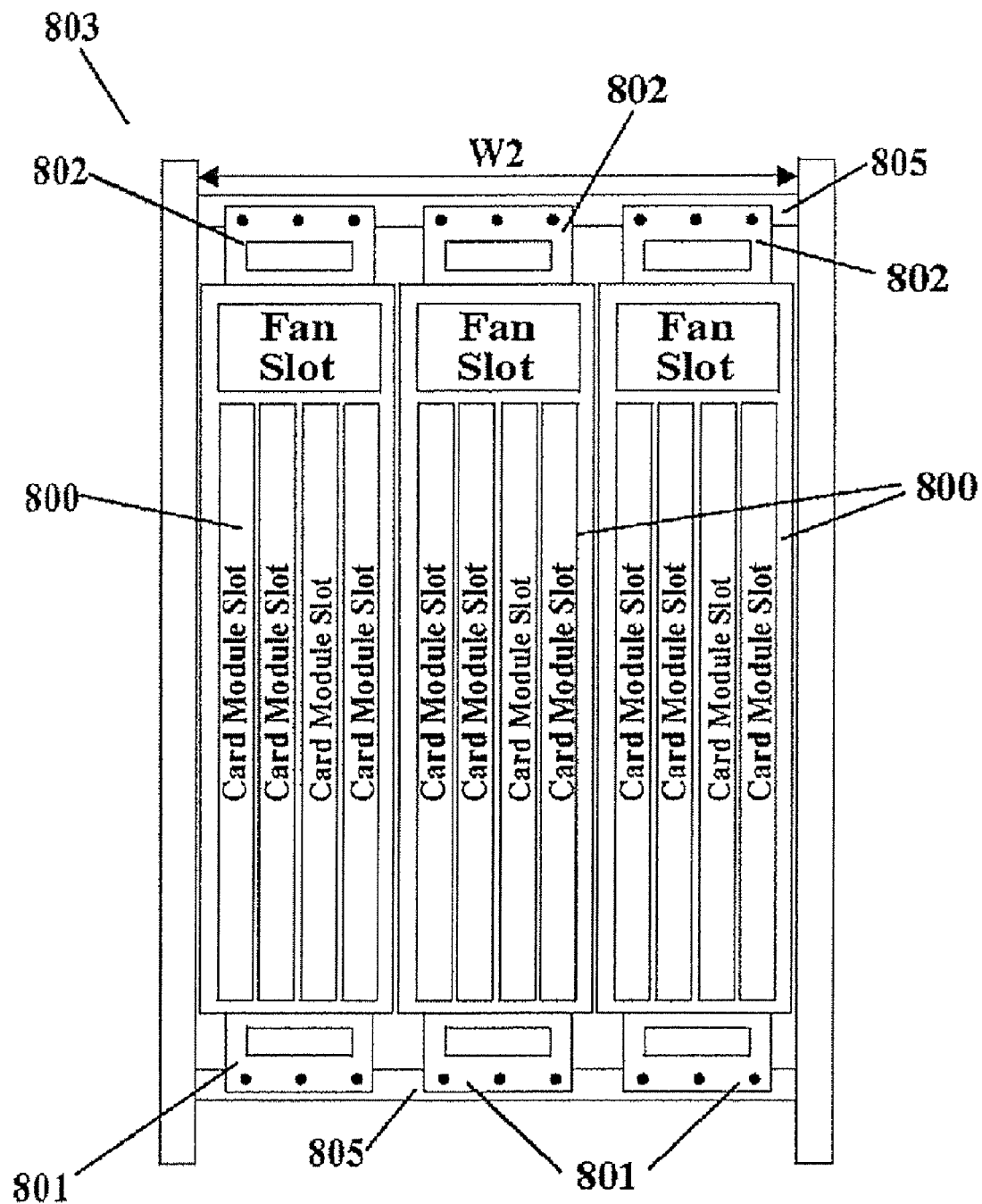
FIG. 8B shows an example of plural chassis mounted in a rack, as viewed from a perspective looking towards a front side thereof.

In FIG. 8A a chassis 800 is vertically mounted in a rack 803 so that it occupies, e.g., one-third of the opening width W2. As can be seen, the number of card module slots in the chassis 800 is less than the number in the chassis 500 of FIG. 5. With the configuration of FIG. 8A, three chassis 800 can be mounted within the rack 803 using brackets 801 and 802. In FIG. 8B three chassis 800 are vertically mounted in a rack 803 between horizontal supports 805. Although one chassis 800 is shown in FIG. 8A and three chassis 800 are shown mounted in FIG. 8B, one of ordinary skill in the art will appreciate in view hereof that the number of chassis mounted vertically in one row of a rack 803 is not limited to the numbers shown, and depends on applicable design criteria and the particular multiple of the chassis width (CW) that is represented by W2.

Figure 9:
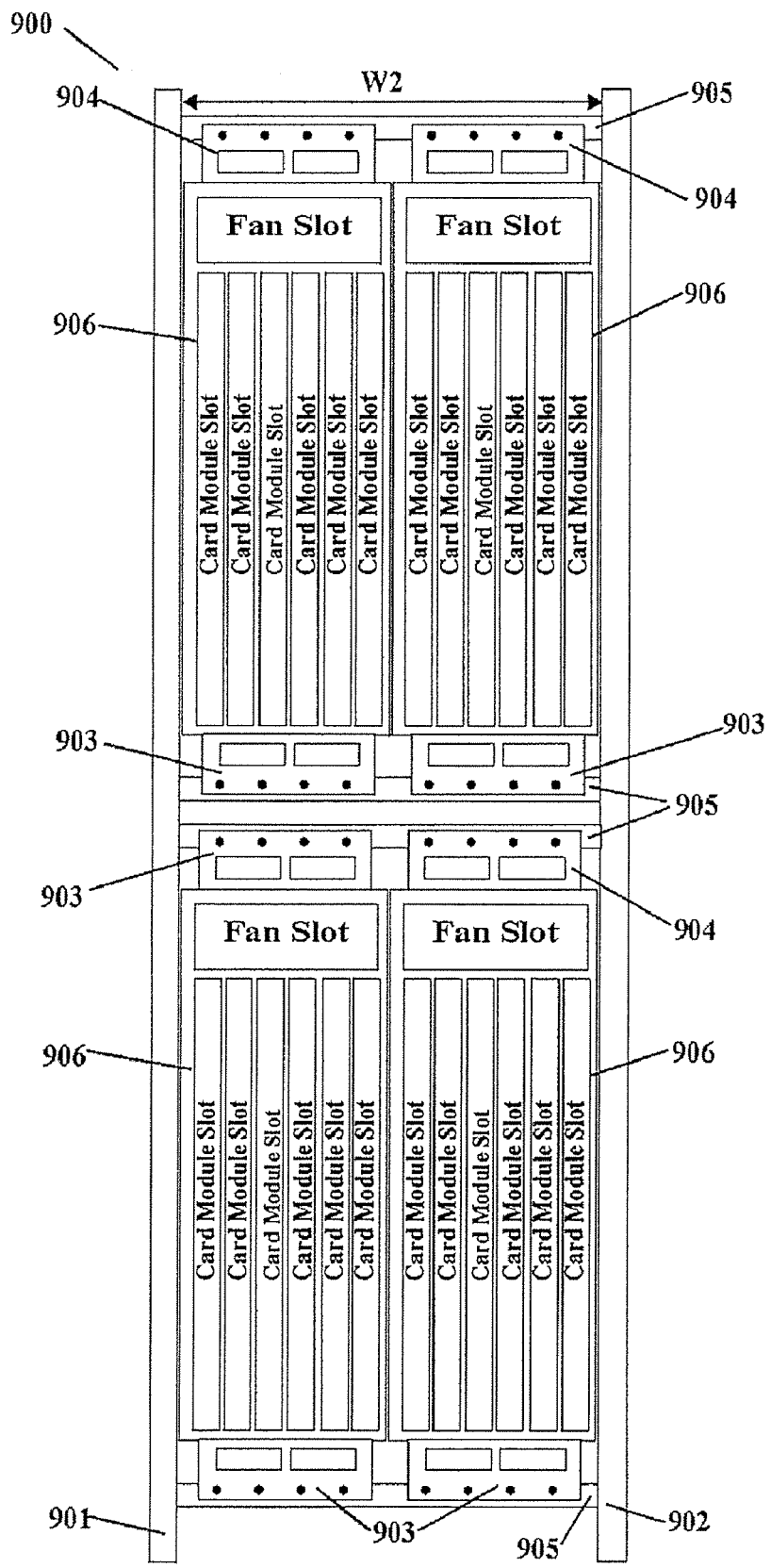
FIG. 9 shows an example of a stack of rows that each include horizontally-adjacent chassis, wherein the stack is arranged vertically in a rack, as viewed from a perspective looking towards a front side thereof.

In FIG. 9 four chassis 906 are mounted vertically in two rows in a rack 900 that includes rack supports 901 and 902. Each row is configured in the same way as in FIG. 7B, the details of which are not repeated again. In FIG. 9 each row of vertically mounted chassis 906 is mounted between a respective set of horizontal supports 905 using brackets 903 and 904. Of course in other embodiments other numbers of rows of chassis 906 can be provided and each row may have a different number of chassis than that depicted. While not shown in FIG. 9, in other example embodiments a structure (not shown) can be interposed between at least one pair of vertically adjacent and vertically oriented chassis, the structure being configured to minimize mixing of exhaust air from a lower disposed chassis with air entering an upper disposed chassis.

Figure 10:
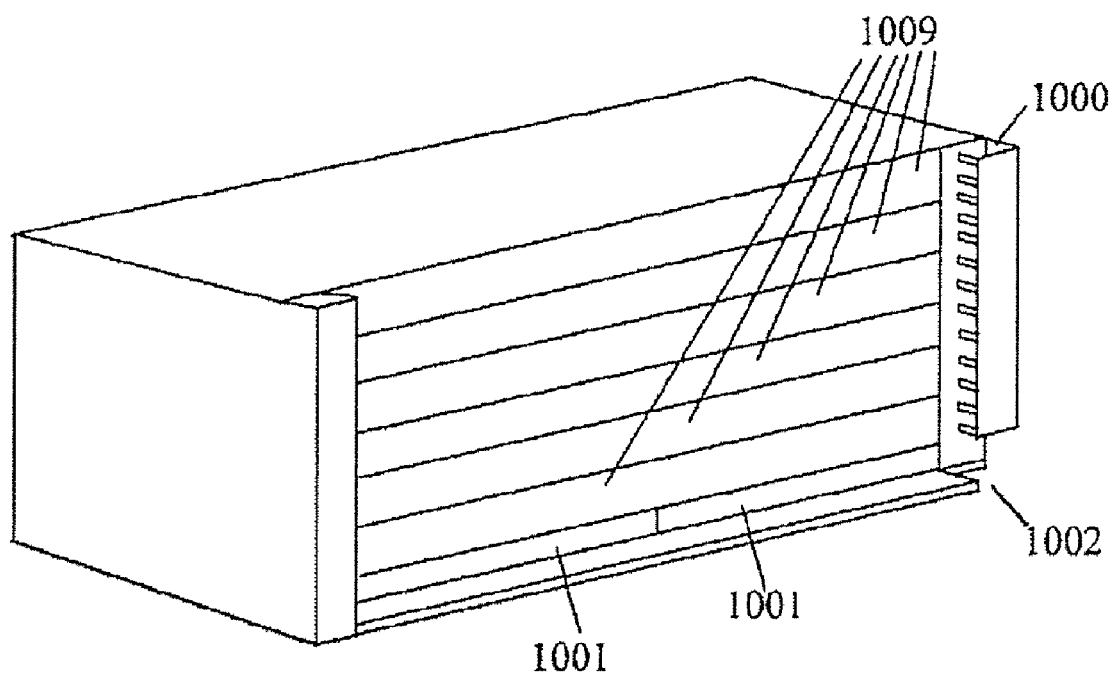
FIG. 10 is a perspective view of a rack mountable chassis in accordance with an example embodiment of the invention.

In the example embodiment illustrated in FIG. 10, the chassis 1002 can include a cable tray 1000 mounted to the front side of the chassis, and that extends along a front face adjacent to one (or both) of the lateral sides. In the illustrated embodiment, the cable tray 1000 extends perpendicularly to card module slots 1009 and 1001. Cable tray 1000 can be at least one component that is removably attached to the front face of the chassis through a suitable attaching mechanism; however in an alternate embodiment the cable tray 1000 may be integral with the chassis housing or be otherwise permanently affixed thereto.

FIG. 10 can be viewed as another construction of the chassis 300 of FIG. 3. For example, FIG. 10 shows another example of a chassis that includes a plurality of card module slots 1001 that are one-half as long as the individual card module slots 1009. One of ordinary skill in the art will appreciate in view of this description that other fractional card module slot lengths (CMSL) (besides one-half) for slots 1001 also may be provided. Such fractionalized card module slots allow for greater flexibility by allowing users to mix and match component types and sizes in cases where more than one component type and size may be required to be used in a single chassis.

Having described various example embodiments of rack-mountable chassis according to the invention, methods according to example embodiments of the invention will now be described.

Before describing those methods in detail, various design parameters that are employed to configure rack-mountable chassis will first be described. Referring again to FIG. 3, the distance between the upper exterior surface 311 of the top side 301 of the chassis 300 and the upper boundary 310 of its adjacent card slot 309 is called the chassis top width overhead (CTWO). The distance between the lower exterior surface 313 of the bottom side 302 of the chassis 300 and the lower boundary 312 of its adjacent card slot is deemed the chassis bottom width overhead (CBWO).

In one method of providing a dual rack-mountable chassis the geometry of a card module (and therefore a card module slot 309) is already known and thus fixed, as is the case in which, for example, a module has already been designed and manufactured. In this case CMSW is not variable. Accordingly, values for CTWO, CBWO, n (described below), and ICMSW are selected so that the opening width W2 of a second rack (rack 2), as in FIG. 7A, is an integer multiple of CW.

Figure 11:
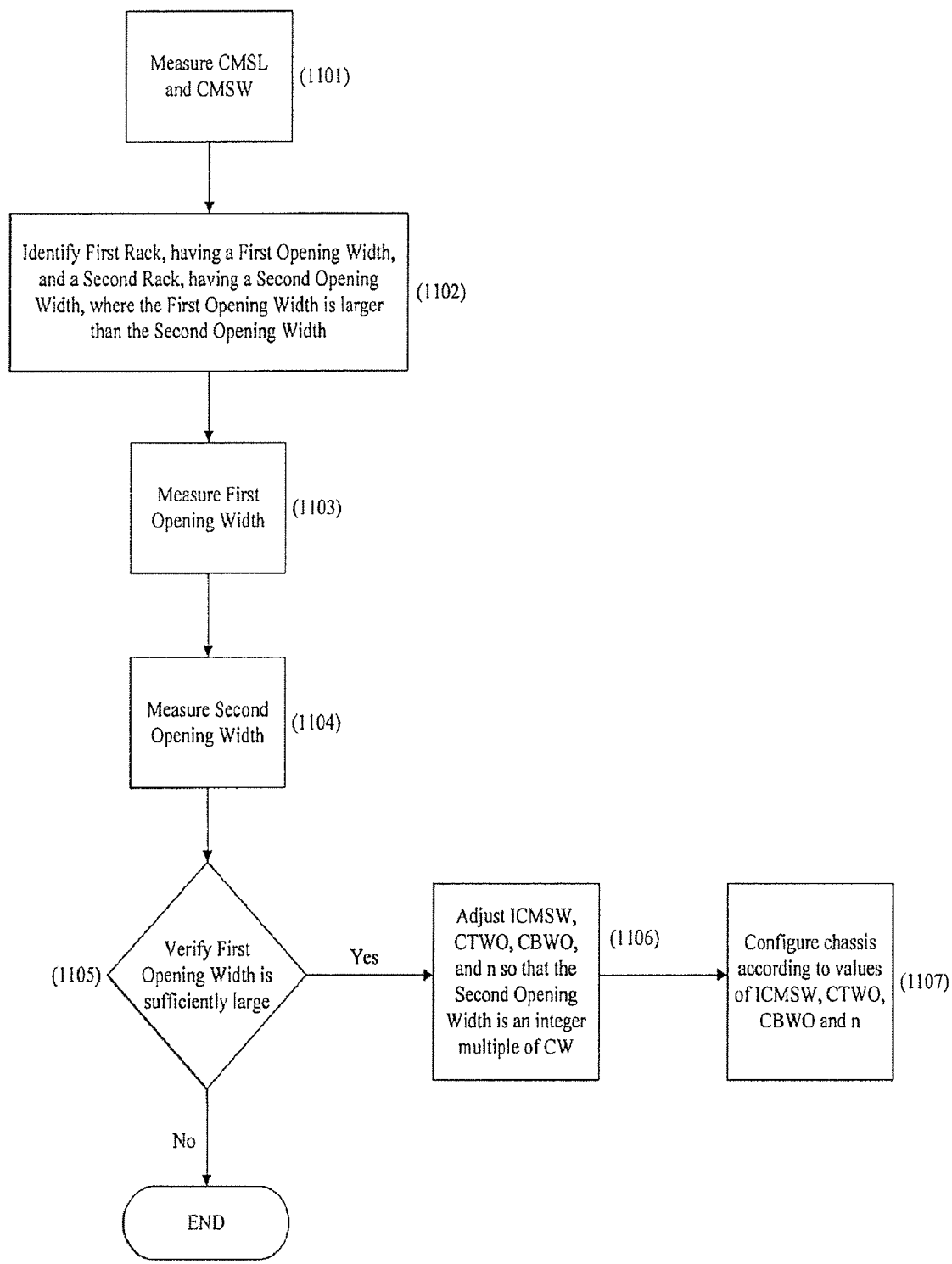
FIG. 11 is a flow diagram of a method according to an example embodiment of the invention for a case in which the width and length of a card module slot are not adjustable design parameters.

FIG. 11 shows a flow diagram of a method for designing/configuring a dual rack-mountable chassis to fit into a first rack (such as, e.g., rack 501) or second rack (such as, e.g., rack 700) having different opening widths (W1 and W2, respectively) when the card module geometry (and therefore the card module slot geometry) is fixed, according to an example embodiment of the invention. In this case, the chassis is configured to be used with modules that are already configured and have known dimensions. Thus, the chassis is configured to be utilized to receive modules of known size and shape.

At block 1101 the card module slot length (CMSL) and width (CMSW) are measured. These measurements are determined based on the known geometry of the module (e.g., 314) that will fit into a card module slot (e.g., 309, 1001) in the chassis. In block 1102 a first rack (rack 1) and a second rack (rack 2) are identified as being a pair of racks having different opening widths (first opening width and second opening width, respectively), where the first opening width is larger than the second opening width. At block 1103 the first opening width is measured and in block 1104 the second opening width is measured. Next, at block 1105, the first opening width of rack 1 is measured to verify whether it is sufficiently wide enough to allow enough clearance on either side of a chassis to at least provide adequate cooling when card modules are mounted horizontally in the chassis and the chassis is mounted in the first rack (rack 1). For example, to make such a verification, known engineering analyses and simulations can be performed based upon factors including, for example, the energy dissipated as heat by modules expected to be housed in the chassis, the volumetric flow rate of cooling air flowing through the chassis by any selected cooling fans, the operating temperature limits of components operating in the chassis, and the expected range of temperatures for air entering the chassis to cool the housed components. Explanation of some examples of such engineering analyses may be found in the publications entitled "Thermal Computations for Electronic Equipment", (Gordon N. Ellison, Van Nostrand Reinhold Company Inc., pages 141-160, 1984) and "2000-2001 Oriental Motor General Catalog", Oriental Motor U.S.A. Corp., pages C-22 to C-24, 2000 which are incorporated by reference herein in their entirety.

As but one example, the verification at block 1105 can take the form of the following process. The maximum power dissipation for each of the modules that will be placed into the proposed chassis can be determined (or set, if known). The maximum ambient temperature of the environment in which the chassis will operate is also determined. The maximum operating temperatures of the various electronic components on each of the modules that will be placed into the chassis is also determined. The maximum operating temperatures of the various electronic components can be used to determine the allowable internal temperature rise within the chassis based upon the heat dissipation of the electronic components on the modules within the chassis. The amount of heat removal suitable to maintain the internal temperature of the chassis at or below the maximum operating temperatures of the electronic components (when operating at the maximum ambient temperature) can then be determined. A volumetric airflow is determined which is sufficient to remove the desired amount of heat. Pages 157-160 of Ellison provide an example of how the temperature rise within a chassis can be computed based upon the knowledge of the airflow resistances within the chassis, the power dissipation of the components within the chassis, the "air flow versus static pressure" curve associated with a given fan used within the chassis, and the ambient temperature at the inlet to the chassis.

A fan size and an air plenum gap (e.g., 506, 507) size can be determined based at least in part on the determined volumetric airflow. In general, the volumetric airflow rate produced, for example, by fans disposed in a fan slot, is directly related to the width (size) of the fans in the slot. That is, in general, a wider fan (and fan slot) can achieve a larger volumetric flow rate than a narrower fan (and fan slot). However, for a given opening width between the vertical supports of a rack, as the width of the fan slot increases, the plenum gaps (e.g., 506, 507) between the sides (e.g., 508, 509) of a horizontally oriented chassis (e.g., 500) and the vertical rack supports (e.g., 502, 503) decreases. Therefore, although wider fans are generally capable of producing a higher volumetric flow rate than narrower fans, if the card module slot length remains fixed, the wider fans also tend to create narrower plenum gaps, which in-turn tend to increase the pressure drop across the chassis, which in-turn increases the need for larger fans to compensate for the higher pressure drop. Thus, there is a tradeoff between the fan size and the plenum gap size. Moreover, larger fans occupy more useable space in the chassis than smaller fans, reducing the amount of available space in the chassis that could be used for housing either a greater quantity of other components, or larger sized components (i.e., longer CMSL). Therefore, where possible, it can be useful to minimize both the fan size and plenum gap sizes in order to maximize the amount of available space in the chassis available to house other components. In general, the air flow over the components within the chassis can be determined by modeling the various airflow resistance elements associated with chassis and its surrounding structures (rack uprights, chassis mounting hardware, etc.). Pages 150-159 of Ellison illustrate how various airflow resistance elements can be modeled.

The determinations described above can be performed at least in part manually or automatically by a computer executing a computer program stored on a storage medium that has been configured to execute at least some of the steps of the verification process. If no suitable combination of fan size and plenum gap size can be determined such that a suitable volumetric air flow rate to remove a desired amount of heat from the chassis can be achieved, then in FIG. 11 the path from the verification block 1105 labeled "No" is followed and configuration ends.

If it is determined that the first opening width of rack 1 is sufficiently large ("YES" at block 1105), then at block 1106 the inter-card module slot width (ICMSW), the chassis top width overhead (CTWO), the chassis bottom width overhead (CBWO), and the number of card module slots (n) are selected or otherwise adjusted so that the second opening width (W2) of rack 2 is an integer multiple (k) of a total width of the chassis (CW). The various parameters are related to each other by the following equation: $CW=CBWO+CTWO+[n \times CMSW]+[(n-1) \times ICMSW]=(W2)/k$. Where one of these parameters is known or is fixed (e.g., by a customer design requirement) for purposes of configuring a chassis, the values of the remaining parameters can be determined according to this mathematical relationship. For example, in block 1107, the value of CMSW and CMSL in one example case are known and fixed by the existing card module geometry, such that the remaining values of ICMSW, CTWO, CBWO, and n, are determined in block 1106, to define the chassis to be constructed.

One example of determining values of the above-noted parameters is to employ a linear optimization algorithm wherein the values of the parameters of the above equation are constrained to certain values while optimizing at least one parameter or relationship among the parameters, such as, for example, finding a set of parameter values that minimize or maximize CTWO while constraining n between two predetermined values. Alternatively, iterative or trial and error approaches to solving the equation also can be employed.

For example, the CMSW parameter may be fixed or set to a value based upon parameters including the length of the existing card modules. In addition, in constraining the CTWO and CBWO parameters, there may also be some known or desired components, such as, for example, electrical connectors and/or indicators associated with the chassis, which may be desired to be placed above or below the card module slots within the chassis. Thus, the dimensions of such types of components may be used to also fix or set each of the values of CTWO and CBWO to respective single values, or alternatively, may be used to constrain the values of those parameters to at least a minimum clearance dimension for including such components. In addition, the inter-card module slot width (ICMSW) parameter is usually fixed or set, for example, to be as small as possible while preventing adjoining modules from physically contacting each other during the installation or removal of the modules, and therefore the dimension of the ICMSW parameter is usually smaller than those of the CTWO and CBWO parameters. The minimum ICMSW value can be used to constrain the value of the ICMSW parameter to a single value for purposes of the configuration, or it may be used to constrain the value of ICMSW to an open range bounded at its low end by the minimum ICMSW value.

In a case where the value of the CMSW parameter is constrained to a single value, the remaining parameters CTWO, CBWO, CW, n, k, and ICMSW can be adjusted, subject to any constraints imposed on those parameters and the constraints that the number of slots n and the number of chassis k are positive integers, where the parameters are again related according to the expression $W2=k \times CW$, and $CW=CBWO+CTWO+[n \times CMSW]+[(n-1) \times ICMSW]$. Different solution sets of values of the parameters to this equation are possible by, for example, constraining the number of chassis k to different values.

In instances where many of the parameters related to the equation noted above are each constrained to a single value, such as when the value of a parameter is known or is not readily adjustable, the solution of the above equation can be greatly simplified. For example, in one simplified example case the value of the CMSW parameter is known based upon the dimensions of a module, and the number of chassis k desired to fit within W2 is fixed, and therefore the chassis width CW is also known based upon the above expression. A further simplification can be achieved by constraining the value of ICMSW to a single value, such as a minimum value sufficient to separate the modules by a sufficient distance to prevent modules from contacting each other, especially during installation and removal of modules. Such a simplification of the value of ICMSW may be useful in practice in order to maximize space within the chassis to house components. The remaining parameters for which values can be adjusted subject to any constraints are CTWO, CBWO, and n. Therefore, for each value of n selected, the values of CTWO and CBWO can be adjusted, subject to any constraints on those values, in order to complete the determination of all the configuration parameter values. Constraints on the values of CTWO and CBWO may be, for example, that those values are at least equal to zero (i.e., they cannot be negative numbers). Of course, alternatively, instead of solving the equation for values of CTWO and CBWO by selecting various values of n, desired values of CTWO and CBWO can be used in the equation to determine whether a positive integer value of n results. If a positive integer value results, the configuration ends. Otherwise, the values of CTWO and CBWO can be adjusted until the resulting value of n is a positive integer value.

When the chassis includes a fan slot (e.g., 308), at least one card module slot (e.g., 309), and a cable tray (e.g., 1000), the verification done at block 1105 also includes verifying that the opening width of the wider one of the first and second racks (rack 1 and rack 2, respectively) is sufficiently wide enough to enable a cable tray (e.g., 1001) to be attached to the chassis (e.g., 300).

In another method of configuring a dual rack-mountable chassis, according to an example embodiment of this invention, the geometry of a card module (and therefore a card module slot) is not known before configuring the chassis (i.e., the geometry of the card module slot is left as a matter of design choice at the time of configuring the chassis). Thus, in this case CMSW, CMSL, CTWO, CBWO, n, k, and ICMSW are selected or otherwise adjusted so that the opening width of rack 2 (W2) is an integer multiple of CW. The relevant design parameters are related by the equation: $CW=CTWO+CBWO+[n \times CMSW]+[(n-1) \times ICMSW]=(W2)/k$, where the parameters are defined to be the same as described above.

Figure 12:
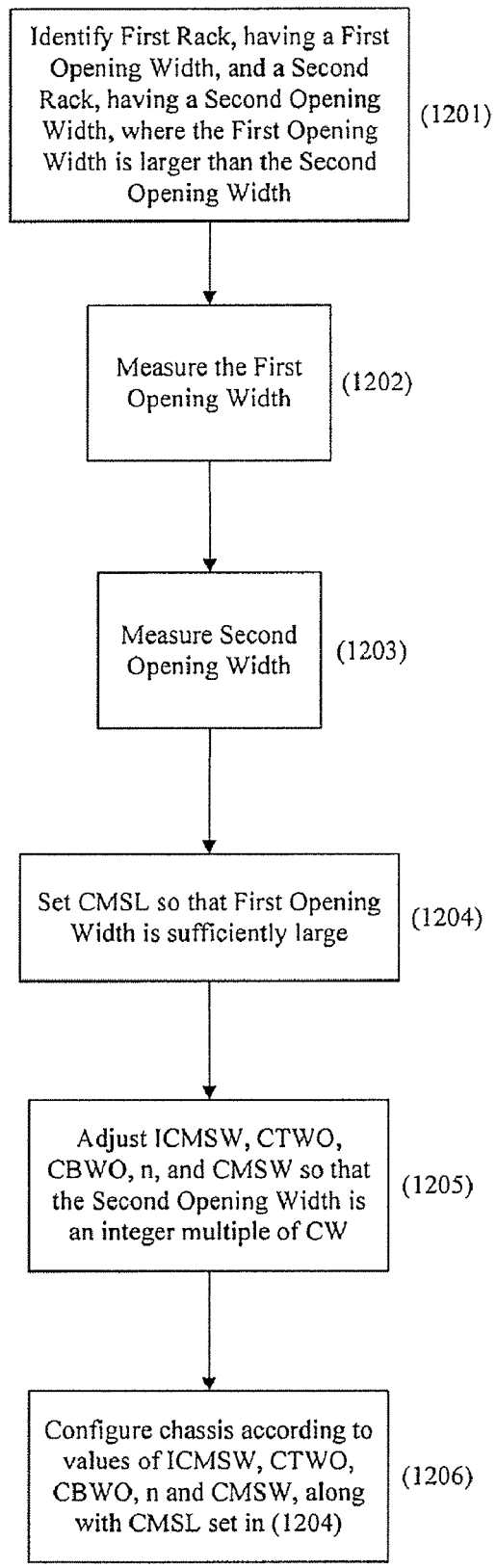
FIG. 12 is a flow diagram of a method according to another example embodiment of the invention for a case in which the width and length of a card module slot are adjustable design parameters.

FIG. 12 shows a flow diagram of an example method for configuring a rack-mountable chassis to fit into a first or second rack of different opening widths when the card module slot geometry is not fixed.

Referring to FIG. 12, in block 1201, a first rack (rack 1) and a second rack (rack 2) are identified as a pair of racks having different opening widths (a first opening width and a second opening width, respectively), where the first opening width is larger than the second opening width. In block 1202, the first opening width is measured and in block 1203 the second opening width is measured. Then, in block 1204, a card module slot length (CMSL) is chosen such that there is sufficient clearance on either side of the chassis to at least provide adequate cooling when a card module is mounted in the slot horizontally and is mounted in a chassis in the first rack (rack 1). In one example embodiment of the invention, the CMSL is selected to be as large as possible while still providing for sufficient clearance on either side of the chassis to at least provide adequate cooling when a card module is mounted in the slot horizontally and is mounted in a chassis in the first rack (rack 1).

For example, to verify that enough clearance is provided on either side of a chassis to at least provide adequate cooling when card modules are mounted horizontally in the chassis and the chassis is mounted in rack 1, known engineering analyses and simulations can be performed based upon factors including, for example, the energy dissipated as heat by modules expected to be housed in the chassis, the volumetric flow rate of cooling air flowing through the chassis by any selected cooling fans, the operating temperature limits of components operating in the chassis, and the expected range of temperatures for air entering the chassis to cool the housed components. See, e.g., the publications by Ellison identified above.

As but one example, the verification occurring at block 1204 can take the form of the following process. The maximum power dissipation for each of the modules that will be placed into the proposed chassis can be determined (or set, if known). The maximum ambient temperature of the environment in which the chassis will operate is also determined. The maximum operating temperatures of the various electronic components on each of the modules that will be placed into the chassis is also determined. The maximum operating temperatures of the various electronic components can be used to determine the allowable internal temperature rise within the chassis based upon the heat dissipation of the electronic components on the modules within the chassis. The amount of heat removal suitable to maintain the internal temperature of the chassis at or below the maximum operating temperatures of the electronic components (when operating at the maximum ambient temperature) can then be determined. A volumetric airflow is determined which is sufficient to remove the desired amount of heat.

A fan size and an air plenum gap (e.g., 506, 507) size can be determined based at least in part on the determined volumetric airflow. In general, the volumetric airflow rate produced, for example, by fans disposed in a fan slot, is directly related to the width of the fans in the slot. That is, in general, a wider fan (and fan slot) can achieve a larger volumetric flow rate than a narrower fan (and fan slot). However, for a given opening width between the vertical supports (e.g., 502, 503) of a rack (e.g., 501), as the width of the fan slot increases, the distances (plenum gaps) between the sides (including ventilation apertures therein) (e.g., 508, 509) of a horizontally oriented chassis (e.g., 500) and the vertical rack supports decreases. Therefore, although wider fans are generally capable of producing a higher volumetric flow rate than narrower fans, there is a tradeoff between the fan size and the plenum gap size. Larger fans occupy more useable space in the chassis than smaller fans, reducing the amount of space in the chassis that could be used for housing either a greater quantity of other components, or larger sized components. Therefore, although wider fans are generally capable of producing a higher volumetric flow rate than narrower fans, there is a tradeoff between the fan size and the plenum gap size. Therefore, where possible, it can be useful to minimize the fan size and plenum gap sizes in order to maximize the amount of available space in the chassis to house other components.

The determinations described above can be performed at least in part manually or automatically by a computer executing a computer program stored on a storage medium that has been configured to execute at least some of the steps of the verification process.

In block 1205, the inter-card module slot width (ICMSW), the chassis top width overhead (CTWO), the chassis bottom width overhead (CBWO), the number of card module slots in the chassis (n), and the card module slot width (CMSW) are selected or otherwise adjusted so that the opening width of rack 2 (W2) is an integer multiple (k) of a total width of the chassis (CW). The values of the undetermined parameters can be determined using similar techniques mentioned above, with respect to determining the values of the parameters when the card module geometry is fixed. However, in determining a value for the CMSW, it can be desirable to minimize the Card Module Slot Width (CMSW) in order to fit as many modules within a chassis as possible. In this regard, the minimum value of CMSW can be determined based upon the largest (i.e., tallest) component height of the components that are anticipated to be included on one of the modules that will be housed within a card module slot of a chassis. In block 1206, a chassis is configured according to the values of ICMSW, CTWO, CBWO, n, and CMSW determined in block 1206, and the value chosen for the CMSL.

When the chassis (e.g., 300) includes a fan slot (e.g., 308), at least one card module slot (e.g., 309), and a cable tray (e.g., 1000) the card module slot length (CMSL) chosen according to block 1204 should also provide sufficient space to enable the cable tray to be attached to the chassis (e.g., 300). In this manner a chassis can be configured having dimensions that optimize all of the available space in at least two different racks while providing for adequate cooling of housed components irrespective of the mounting orientation in each of those two racks. For example, when a chassis is configured according to the methods shown in FIGS. 11 and 12, a chassis can be mounted horizontally in rack 1 to occupy a maximum of the opening width of rack 1, while that same chassis can be mounted vertically in rack 2, in integer multiples to occupy a maximum of the opening width of rack 2. Moreover, when chassis are configured according to the method of FIG. 12, the optimal geometry of both the module slots (and therefore the modules that are received into those slots) and the chassis are determined simultaneously.

It should be noted that the references to various components of certain structural embodiments of the invention, in the description of FIGS. 11 and 12 above, are for illustrative purposes only, and are not intended to be limiting to the scope of those methods. Indeed, those example methods are applicable to any structural embodiments described herein or otherwise within this invention's scope. Furthermore, the techniques illustrated in FIGS. 11 and 12 may be performed sequentially, in parallel, or in an order other than that which is described, and those techniques can be performed manually or automatically such as by a computer. It should be appreciated in view of this description that not all of the techniques described are required to be performed, that additional techniques may be added, and that some of the illustrated techniques may be substituted with other techniques.

The above described example embodiments of the dual rack-mountable chassis are useful in various ways. As but one example, a chassis can be designed and manufactured to serve both the North American and European telecommunications markets for housing fiber optic modular equipment. In North America and Europe, telecommunication racks having a nineteen (19) inch opening width are deployed. Also deployed in Europe are telecommunication racks having an opening width standardized by the European Telecommunications Standards Institute (ETSI). Moreover, telecommunication racks having an opening width of twenty three inches are deployed in North America. Using the example method and system described in the foregoing description, a chassis may be configured for multiple opening widths (and therefore geographical markets) while optimally utilizing the available space in the rack. For example, for North American racks, chassis of this invention can be configured for horizontal mounting, while for European racks the same chassis can be mounted vertically, in integer multiples, to optimally utilize all of the available opening width space of the narrower ETSI rack. By doing so, for example, telecommunications equipment designers and manufacturers can standardize on one chassis and one set of modules that are compatible with the chassis. The ability to create one standard chassis and module product family can also reduce the cost of design, manufacturing, distribution, technical support, training, and inventory required for supporting multiple product families based on physical hardware configuration. Other benefits also exist and would be readily appreciated by one skilled in the art in view of this description.

While the invention has been described in the context of a dual-rack mountable chassis, broadly construed, the invention is not so limited. For example, in other embodiments the rack mountable chassis according to the invention may be constructed in a non-dual configuration, such as another multiple configuration.

While the invention has been particularly shown and described with respect to example embodiments thereof, it will be understood by those skilled in the art that changes in form and details may be made therein without departing from the scope and spirit of the invention.

What is claimed is:

1. A chassis, comprising:
   a housing having plural mechanically inter-connected sides that collectively enclose a volume in which at least one card module can be arranged, the sides including a first lateral side and a second lateral side opposite the first lateral side and having a plurality of vents therein, the housing also having a plurality of slots at least one of which houses at least one fan disposed adjacent the first lateral side, the chassis being arrangeable in one of a horizontally-disposed orientation in a first rack having a first opening width, and a vertically-disposed orientation in a second rack having a second opening width, the first opening width being greater than the second opening width, the chassis having a predetermined chassis width of a size such that the second opening width is an integer multiple of the predetermined chassis width, the chassis width being sized to provide cooling for housed components when the chassis is disposed horizontally in the first rack and vertically in the second rack by accommodating forced movement of air pulled by the at least one fan along a direction from the second lateral side towards and exhausted by the at least one fan through the plurality of vents in the first lateral side, without requiring the forced movement of air to reverse direction; and
   at least one mounting mechanism to facilitate coupling of the chassis to at least one of the first and second racks, the at least one mounting mechanism having at least one ventilation aperture through which the air passes.

2. The chassis according to claim 1, wherein an exhaust side of the at least one fan faces the first lateral side.

3. The chassis according to claim 2, wherein the plurality of slots also includes at least one card module slot for receiving and housing the at least one card module.

4. The chassis according to claim 3, wherein the card module slot has dimensions defined by a card module slot width (CMSW), a card module slot length (CMSL), and a card module slot depth (CMSD).

5. The chassis according to claim 4, wherein the card module slot length (CMSL) of the chassis is selected so that cooling of housed components is provided when a card module is disposed horizontally in a chassis card module slot having the CMSL and the chassis is disposed horizontally in the first rack.

6. The chassis according to claim 3, wherein the plurality of slots also includes at least one air plenum slot located on an opposite side of the card module slot from the fan slot and wherein the air plenum slot includes an opening in a front side of the chassis.

7. The chassis according to claim 3, wherein the at least one slot which houses the at least one fan is positioned with respect to the at least one card module slot such that the at least one fan provides for forced air movement across the at least one card module slot.

8. The chassis according to claim 7, wherein at least one of the sides of the housing includes at least one transverse side having at least one ventilation opening formed therein and through which air is pulled by the at least one fan.

9. The chassis according to claim 3, wherein the plurality of slots includes at least one slot to house an air filter.

10. The chassis according to claim 4, wherein the at least one card module slot is configured to house at least one card module having a card module length that is a fraction of the card module slot length (CMSL).

11. The chassis according to claim 10, wherein the fraction is one-half.

12. The chassis according to claim 1, wherein when the chassis is disposed horizontally in the first rack the chassis is mechanically coupled to the first rack by way of the at least one mounting mechanism, and when the chassis is disposed vertically in the second rack the chassis is mechanically coupled to the second rack by way of the at least one mounting mechanism.

13. The chassis according to claim 11, wherein the first and second racks are configured to house a plurality of adjacent chassis forming a stack.

14. The chassis according to claim 12, wherein the at least one mounting mechanism comprises supports to facilitate coupling of the chassis to at least one of the racks.

15. The chassis according to claim 14, wherein the at least one mounting mechanism forms at least one plenum gap between the chassis and the at least one rack.

16. The chassis according to claim 1, wherein the housing is defined by a chassis width (CW), an inter-card module slot width (ICMSW), a card module slot width (CMSW), a chassis top width overhead (CTWO), a chassis bottom width overhead (CBWO), and a number of card module slots (n),
   wherein the card module slot width (CMSW) is predetermined based on a dimension of a card module to be used in the chassis,
   wherein the chassis width (CW) satisfies the relationship CW=CBWO+CTWO+[n×CMSW]+[(n−1)×ICMSW], and wherein the chassis is constructed having values for at least one of the chassis width (CW), the inter-card module slot width (ICMSW), the chassis top width overhead (CTWO), the chassis bottom width overhead (CBWO), and the number of card module slots (n), wherein the opening width of the second rack is the integer multiple of the chassis width (CW).

17. The chassis according to claim 1, wherein the sides also include a front side that includes at least one front side ventilation opening, and at least one of the first lateral side and the second lateral side is horizontally spaced from the first rack when the chassis is oriented in a horizontal position in the first rack such that at least one ventilation path is formed between the at least one front side ventilation opening and the vents of the first lateral side.

18. A rack mounted chassis system, comprising:
   at least one of a first rack and a second rack; and
   a plurality of chassis mounted to the at least one rack, each chassis comprising a housing having plural mechanically inter-connected sides that collectively enclose a volume in which at least one card module can be arranged, the sides including a first lateral side and a second lateral side opposite the first lateral side and having a plurality of vents therein, the housing also having a plurality of slots at least one of which houses at least one fan disposed adjacent the first lateral side, the housing being arrangeable in one of a horizontally-disposed orientation in the first rack having a first opening width, and a vertically-disposed orientation in the second rack having a second opening width, the first rack opening width being greater than the second rack opening width, the housing having a predetermined chassis width of a size such that the second rack opening width is an integer multiple of the predetermined chassis width, the chassis width being sized to provide cooling for housed components when the chassis is disposed horizontally in the first rack and vertically in the second rack by accommodating forced movement of air pulled by the at least one fan along a direction from the second first lateral side towards and exhausted by the at least one fan through the plurality of vents in the first lateral side; and
   at least one mounting mechanism to facilitate coupling of the chassis to at least one of the racks, the at least one mounting mechanism having at least one ventilation aperture through which the air passes.

19. The system according to claim 18, wherein the housing of each chassis is defined by a chassis width (CW), an inter-card module slot width (ICMSW), a card module slot width (CMSW), a chassis top width overhead (CTWO), a chassis bottom width overhead (CBWO), and a number of card module slots (n),
   wherein the card module slot width (CMSW) is predetermined based on a dimension of a card module to be used in the chassis,
   wherein the chassis width (CW) satisfies the relationship $CW=CBWO+CTWO+[n \times CMSW]+[(n-1) \times ICMSW]$, and wherein the chassis is constructed having values for at least one of the chassis width (CW), the inter-card module slot width (ICMSW), the chassis top width overhead (CTWO), the chassis bottom width overhead (CBWO), and the number of card module slots (n), wherein the opening width of the second rack is the integer multiple of the chassis width (CW).

20. The system of claim 18, wherein the plurality of chassis includes four chassis, two of the four chassis being mounted above two other ones of the chassis.

21. The system of claim 18, wherein the plurality of chassis includes four chassis arranged in a columnar configuration.

* * * * *

UNITED STATES PATENT AND TRADEMARK OFFICE
CERTIFICATE OF CORRECTION

| | |
|---|---|
| PATENT NO. | : 8,328,026 B2 |
| APPLICATION NO. | : 12/036041 |
| DATED | : December 11, 2012 |
| INVENTOR(S) | : Mark E. Boduch et al. |

It is certified that error appears in the above-identified patent and that said Letters Patent is hereby corrected as shown below:

ON THE TITLE PAGE [57] ABSTRACT:

Line 2, "arrange" should read --arranged--.

DRAWING SHEET 2:

Fig. 3, "Chasis" should read --Chassis--.

IN THE SPECIFICATION:

COLUMN 2:

Line 45, "a example" should read --an example--.

COLUMN 3:

Line 65, "a exhaust" should read --an exhaust--.

COLUMN 5:

Line 21, "500, however," should read --500; however,--; and
Line 46, "708, however," should read --708; however,--.

COLUMN 6:

Line 11, "Alternatively," should read --Alternatively, in--;
Line 12, "brackets" should read --bracket--; and
Line 18, "there through." should read --therethrough.--.

Signed and Sealed this
Thirtieth Day of April, 2013

Teresa Stanek Rea
*Acting Director of the United States Patent and Trademark Office*

CERTIFICATE OF CORRECTION (continued)
U.S. Pat. No. 8,328,026 B2

COLUMN 8:

Line 39, "decreases." should read --decrease.--;
    Line 43, "in-turn" should read --in turn--; and
    Line 44, "in-turn" should read --in turn--.

IN THE CLAIMS:

COLUMN 14:

Line 37, "claim 11," should read --claim 1,--.

COLUMN 15:

Line 27, "first" should be deleted.